United States Patent
Sun et al.

(10) Patent No.: US 12,445,090 B2
(45) Date of Patent: Oct. 14, 2025

(54) HEAT DISSIPATION APPARATUS AND PHOTOVOLTAIC INVERTER

(71) Applicant: Huawei Digital Power Technologies Co., Ltd., Shenzhen (CN)

(72) Inventors: Faming Sun, Dongguan (CN); Quanming Li, Dongguan (CN); Jun Chen, Dongguan (CN)

(73) Assignee: HUAWEI DIGITAL POWER TECHNOLOGIES CO., LTD., Shenzhen (CN)

(*) Notice: Subject to any disclaimer, the term of this patent is extended or adjusted under 35 U.S.C. 154(b) by 430 days.

(21) Appl. No.: 18/061,075

(22) Filed: Dec. 2, 2022

(65) Prior Publication Data

US 2023/0096967 A1 Mar. 30, 2023

Related U.S. Application Data

(63) Continuation of application No. PCT/CN2021/089716, filed on Apr. 25, 2021.

(30) Foreign Application Priority Data

Jun. 4, 2020 (CN) .......................... 202010499300.4

(51) Int. Cl.
  *H02S 40/42* (2014.01)
  *H02S 40/32* (2014.01)
  *H05K 7/20* (2006.01)

(52) U.S. Cl.
  CPC ....... *H02S 40/425* (2014.12); *H05K 7/20163* (2013.01); *H05K 7/20918* (2013.01); *H02S 40/32* (2014.12)

(58) Field of Classification Search
  CPC ........... H05K 7/20136; H05K 7/20145; H05K 7/20154; H05K 7/20163; H05K 7/20172;
  (Continued)

(56) References Cited

U.S. PATENT DOCUMENTS

2002/0003690 A1* 1/2002 Lin ...................... H01L 23/467
  257/E23.099
2002/0185259 A1* 12/2002 Park ..................... H01L 23/467
  257/E23.099

(Continued)

FOREIGN PATENT DOCUMENTS

CN         1411332 A      4/2003
CN       104600960 A   *  5/2015
  (Continued)

OTHER PUBLICATIONS

CN-115413200-A English Translation (Year: 2022).*
CN-104600960-A English Translation (Year: 2015).*
TW-201228585-A English Translation (Year: 2018).*

*Primary Examiner* — Amir A Jalali
(74) *Attorney, Agent, or Firm* — WOMBLE BOND DICKINSON (US) LLP

(57) ABSTRACT

A heat dissipation apparatus and a photovoltaic inverter are related to the field of heat dissipation device technologies, to improve a heat dissipation capability of the heat dissipation apparatus. The heat dissipation apparatus includes at least two stacked fan layers, and each fan layer includes at least one fan. A heat dissipation channel in a radiator has a first inlet, and the first inlet communicates with each air exhaust vent in at least one fan layer by using an air duct component. Compared with a solution in which fans are arranged along a width direction of the radiator, the at least two fan layers are stacked, which may not be limited by a width of the radiator. More fans can be arranged in a hierarchical stacking manner, and more fans can increase an overall amount of exhausted air, thereby improving the heat dissipation capability of the heat dissipation apparatus.

20 Claims, 15 Drawing Sheets

(58) Field of Classification Search
CPC .. H05K 7/202; H05K 7/20209; H05K 7/2039;
H05K 7/409; H05K 7/206; H05K 7/2074;
H05K 7/20854; H05K 7/20863; H05K
7/2089; H05K 7/209; H05K 7/20909;
H05K 7/20918; H05K 7/20936; H05K
5/0213; H05K 5/0217; H01L 23/367;
H01L 23/427; H02M 1/327; H02S 40/32;
H02S 40/425
See application file for complete search history.

(56) References Cited

U.S. PATENT DOCUMENTS

| | | | |
|---|---|---|---|
| 2008/0130232 A1* | 6/2008 | Yamamoto | H05K 7/209 |
| | | | 361/703 |
| 2008/0144279 A1* | 6/2008 | Yamamoto | H05K 7/20918 |
| | | | 361/694 |
| 2008/0247136 A1* | 10/2008 | Peng | H01L 23/467 |
| | | | 257/E23.099 |
| 2011/0175007 A1 | 7/2011 | Sato et al. | |
| 2012/0014154 A1 | 1/2012 | Siracki et al. | |
| 2013/0343110 A1* | 12/2013 | Liu | H05K 7/20909 |
| | | | 363/141 |
| 2014/0014313 A1 | 1/2014 | Hong et al. | |
| 2016/0091264 A1 | 3/2016 | Lu et al. | |

FOREIGN PATENT DOCUMENTS

| | | | | |
|---|---|---|---|---|
| CN | 207782555 U | 8/2018 | | |
| CN | 208939804 U | 6/2019 | | |
| CN | 110440342 A | 11/2019 | | |
| CN | 111817661 A | 10/2020 | | |
| CN | 115413200 A | * 11/2022 | | H02M 1/00 |
| EP | 2879475 A1 | 6/2015 | | |
| TW | 200819031 A | 4/2008 | | |
| TW | 201228585 A | * 7/2012 | | |

* cited by examiner

HEAT DISSIPATION APPARATUS AND PHOTOVOLTAIC INVERTER

CROSS-REFERENCE TO RELATED APPLICATIONS

This application is a continuation of International Application No.: PCT/CN2021/089716, filed on Apr. 25, 2021, claims priority to Chinese Patent Application No. 202010499300.4, filed on Jun. 4, 2020. The disclosures of the aforementioned applications are hereby incorporated by reference in their entireties

TECHNICAL FIELD

The present disclosure relates to the field of heat dissipation technologies, and in particular, to a heat dissipation apparatus and a photovoltaic inverter.

BACKGROUND

A photovoltaic inverter is an inverter that can convert a variable direct-current voltage generated by a photovoltaic solar panel into an alternating current with a mains frequency. The converted alternating current may be fed back to a commercial power transmission system, or may be used by an off-the-grid power grid.

In a related technology, as shown in FIG. 1 and FIG. 2, a photovoltaic inverter generally includes an inverter cabinet 1, a circuit board 101, a switch device 102, and a heat dissipation apparatus 2. The switch device 102 may be an insulated gate bipolar transistor (IGBT). The inverter cabinet 1 generally includes an electrical cavity and a heat dissipation cavity that are mutually isolated. The switch device 102 is disposed on the circuit board 101 located in the electrical cavity, and the heat dissipation apparatus 2 is disposed in the heat dissipation cavity. The heat dissipation apparatus 2 includes a radiator 20 and two fans 301. The radiator 20 includes a substrate and a plurality of heat dissipation sheets vertically mounted on the substrate. The substrate is attached against a side wall that is of the heat dissipation cavity and that faces the electrical cavity. The plurality of heat dissipation sheets are disposed in parallel on the substrate. A heat dissipation channel is formed between two adjacent heat dissipation sheets. The two fans 301 are disposed at a bottom of the radiator 20. The two fans 301 are located in a same plane parallel to the substrate, and a line connecting the two fans 301 is perpendicular to the heat dissipation sheets. During operation, the fan 301 conveys air to the heat dissipation channel, and heat is exchanged between the air and the heat dissipation sheet, to dissipate heat from the switch device 102 in the electrical cavity.

However, when the foregoing manner of arranging the fans 301 is used, a quantity of fans 301 that can be arranged is relatively small, and the relatively small quantity of fans 301 leads to a relatively small overall amount of air exhausted by the heat dissipation apparatus 2. As a result, a heat dissipation capability of the heat dissipation apparatus 2 is restricted.

SUMMARY

Embodiments of the present disclosure provide a heat dissipation apparatus and a photovoltaic inverter, to improve a heat dissipation capability of the heat dissipation apparatus.

In some embodiments, the present disclosure provides a heat dissipation apparatus, including a radiator, an air duct component, and at least two fan layers. The at least two fan layers are stacked along a direction perpendicular to a faying surface of the radiator. Each fan layer includes at least one fan, and the fan includes an air exhaust vent. The radiator includes a heat dissipation channel, and an end that is of the heat dissipation channel and that faces the fan layer has a first inlet. The first inlet communicates with each air exhaust vent in at least one fan layer by using the air duct component.

According to the foregoing technical means, in a case of a same width of the radiator and a same shape and size of the fan, compared with a solution that is in a related technology and in which a plurality of fans are arranged along a straight line parallel to a width direction of the radiator, in this embodiment of the present disclosure, the at least two fan layers of the heat dissipation apparatus are stacked, which may not be limited by the width of the radiator. More fans can be arranged in a hierarchical stacking manner, and more fans can increase an overall amount of exhausted air, thereby improving a heat dissipation capability of the heat dissipation apparatus. In addition, a plurality of fans arranged along a straight line are included in a related technology. When a quantity of fans and a width of the radiator in this embodiment of the present disclosure are consistent with those in the related technology, due to a hierarchical stacking manner, a quantity of fans in each fan layer decreases compared with a quantity of fans in each fan layer in the related technology. The decrease in the quantity of fans enables a space available to each fan to become larger, so that an air cavity space of each fan can be enlarged. The enlarged air cavity space enables each fan to obtain a larger amount of exhausted air, thereby increasing an overall amount of exhausted air and improving a heat dissipation capability of the heat dissipation apparatus.

In some embodiments, the fan further includes an air intake vent, and at least one interval space obtained in each fan layer through separation by the fan in the fan layer. In two adjacent fan layers, an air intake vent of a fan in an inner fan layer communicates with an interval space in an outer fan layer. In some embodiments, in the adjacent fan layers, air from the fan in the inner fan layer enters through the interval space in the outer fan layer. Therefore, a separate air intake area does not need to be added to an outer side of the fan layer, and a volume occupied by a plurality of fan layers is not additionally increased, thereby facilitating air intake of the fan in each fan layer.

In some embodiments, in the two adjacent fan layers, an air intake vent in the inner fan layer is located in projection that is of the interval space in the outer fan layer and that is on the inner fan layer; and an air intake vent in the outer fan layer is located in projection that is of the interval space in the inner fan layer and that is on the outer fan layer. In some embodiments, it can be ensured that the air intake vent in the inner fan layer directly faces the interval space in the outer fan layer, and air can directly enter the air intake vent in the inner fan layer through the interval space. This can reduce resistance generated when air flows from the interval space to the air intake vent, and prevent a tortuous path through which the air flows from the interval space to the air intake vent in the inner fan layer.

In some embodiments, the fan includes a fan box and a centrifugal fan. The fan box has an air cavity, an air intake vent, and an air exhaust vent. The air intake vent and the air exhaust vent communicate with the air cavity. An opening direction of the air intake vent is perpendicular to an opening direction of the air exhaust vent. The centrifugal fan is disposed in the air cavity. In this embodiment, the centrifugal fan is used. A relatively common axial flow fan has advantages such as a large air amount and press head, good performance, and low costs.

In some embodiments, the fan box is a cuboid box. The air intake vent and the air exhaust vent are respectively disposed on two adjacent side surfaces of the fan box. In this embodiment, the two adjacent side surfaces of the cuboid box are perpendicular to each other. Opening directions of the air intake vent and the air exhaust vent of the fan that are disposed on the two side surfaces perpendicular to each other are naturally perpendicular to each other. This setting manner is simple and easy to implement.

In some embodiments, the radiator includes a second inlet communicating with the heat dissipation channel. The second inlet is located in a downstream position of the first inlet. The second inlet communicates with each air exhaust vent in the at least one fan layer by using the air duct component.

In some embodiments, air flowing from one part of the fan layers enters the heat dissipation channel from the first inlet by using the air duct component, and air flowing from the other part of the fan layers enters the heat dissipation channel from the second inlet by using the air duct component. The first inlet is located in an upstream position of the heat dissipation channel relative to the second inlet. Therefore, heat is first exchanged between the air entering the heat dissipation channel from the first inlet and the radiator located between the first inlet and the second inlet, and a temperature of an air flow increases after the heat exchange, to form hot air. After reaching a position of the second inlet, the hot air meets the air entering from the second inlet. A temperature of the air entering from the second inlet is relatively low, and the air with the relatively low temperature is mixed with the hot air, to implement a mixture of cold and hot air. Therefore, a temperature of the hot air in the heat dissipation channel is reduced, thereby reducing impact made on the second inlet and a radiator located at a downstream position of the second inlet by the radiator located between the first inlet and the second inlet, alleviating heat cascading between an upstream switch device corresponding to an upstream radiator of the second inlet and a downstream switch device corresponding to a downstream radiator of the second inlet, and ensuring operation performance of a photovoltaic inverter.

In some embodiments, the radiator includes a substrate and a plurality of heat dissipation sheets vertically mounted on the substrate. The plurality of heat dissipation sheets are disposed in parallel on the substrate. A heat dissipation channel is formed between every two adjacent heat dissipation sheets. An end opening formed at ends of every two adjacent heat dissipation sheets is the first inlet, and a top opening formed at tops that are of every two adjacent heat dissipation sheets and are away from the substrate is the second inlet. In this embodiment, the radiator forms the first inlet and the second inlet by using a structural feature of the radiator. This structure is simple and easy to implement without special processing.

In some embodiments, each heat dissipation sheet includes a front heat dissipation section and a rear heat dissipation section, and the front heat dissipation section is closer to the first inlet than the rear heat dissipation section. A top opening formed at tops of every two adjacent front heat dissipation sections is the second inlet. A height of the front heat dissipation section relative to the substrate is not higher than a height of the rear heat dissipation section relative to the substrate.

In some embodiments, when the height of the front heat dissipation section relative to the substrate is lower than the height of the rear heat dissipation section relative to the substrate, an exhausted air flow entering from the second inlet may relatively easily enter a bottom position that is of the rear heat dissipation section and that is close to the substrate. Therefore, the exhausted air flow entering the heat dissipation channel from the second inlet and an exhausted air flow that is in the heat dissipation channel and that flows from the first inlet into the bottom position are in sufficient contact, to implement sufficient heat exchange, thereby improving an air mixing effect, further alleviating heat cascading between an upstream switch device and a downstream switch device, and ensuring operation performance of the photovoltaic inverter.

In some embodiments, along a direction from the front heat dissipation section to the rear heat dissipation section, a height of the front heat dissipation section relative to the substrate gradually increases to a height the same as that of the rear heat dissipation section.

In this embodiment, along a direction from the front heat dissipation section to the rear heat dissipation section, a top surface of the front heat dissipation section is an inclined plane whose front is low and rear is high. In some embodiments, an exhausted air flow entering from the second inlet may more easily enter a bottom position that is of the rear heat dissipation section and that is close to the substrate. Therefore, the exhausted air flow entering the heat dissipation channel from the second inlet and an exhausted air flow that is in the heat dissipation channel and that flows from the first inlet into the bottom position are in sufficient contact, to implement sufficient heat exchange, thereby improving an air mixing effect, further alleviating heat cascading between an upstream switch device and a downstream switch device, and ensuring operation performance of the photovoltaic inverter.

In some embodiments, the air duct component includes a top panel and side panels disposed surrounding the top panel. The top panel and the side panels form an air duct. The air exhaust vents, the first inlets, and the second inlets of the at least two fan layers communicate with the air duct. In this setting, the air exhaust vent, the first inlet, and the second inlet communicate with a same air duct component, that is, one air duct component can be used to provide air for the first inlet and the second inlet. This structure is simple and easy to implement.

In some embodiments, the heat dissipation apparatus includes two fan layers, which are respectively a first fan layer located in an inner layer and a second fan layer located in an outer layer. The air duct component includes a partition panel disposed in an air duct. One end of the partition panel is connected to the radiator, and the other end of the partition panel extends to a contact area between the first fan layer and the second fan layer. The partition panel separates the air duct into a first air duct and a second air duct. One end of the first air duct communicates with each air exhaust vent in the first fan layer, and the other end of the first air duct communicates with the first inlet. One end of the second air duct communicates with each air exhaust vent in the second fan layer, and the other end of the second air duct communicates with the second inlet.

In some embodiments, the first fan layer located in the inner layer may provide air for the first inlet through the first air duct, and the second fan layer located in the outer layer may provide air for the second inlet through the second air duct. The first inlet and the second inlet each are provided with air by using a separate air duct, and correspond to a separate fan layer, to avoid a case in which air flowing from a fan layer communicating with the first inlet is mixed, in the air duct, with air flowing from another fan layer, so that an air path embodiment is more proper.

In some embodiments, the heat dissipation apparatus includes four fan layers successively stacked, which are successively a first fan layer, a second fan layer, a third fan layer, and a fourth fan layer from an inner layer to an outer layer. The air duct component includes a partition panel disposed in an air duct. The partition panel separates the air duct into a first air duct and a second air duct. The first inlet communicates with each air exhaust vent in the first fan layer through the first air duct, and the second inlet communicates with each air exhaust vent in the second fan layer, the third fan layer, and the fourth fan layer through the second air duct.

In this embodiment, air flowing from the first fan layer enters the first inlet through the first air duct, and air flowing from the second fan layer, the third fan layer, and the fourth fan layer enters the second inlet through the second air duct. An air flow quantity of the second inlet is greater than an air flow quantity of the first inlet, thereby improving an air mixing effect, further alleviating heat cascading between an upstream switch device and a downstream switch device, and ensuring operation performance of the photovoltaic inverter.

In some embodiments, the heat dissipation apparatus includes four fan layers successively stacked, which are successively a first fan layer, a second fan layer, a third fan layer, and a fourth fan layer from an inner layer to an outer layer. The air duct component includes three partition panels disposed in an air duct. The three partition panels separate the air duct into a first air duct, a second air duct, a third air duct, and a fourth air duct. The first inlet communicates with each air exhaust vent in the first fan layer through the first air duct. The second inlet communicates with each air exhaust vent in the second fan layer through the second air duct. The second inlet communicates with each air exhaust vent in the third fan layer through the third air duct. The second inlet communicates with each air exhaust vent in the fourth fan layer through the fourth air duct.

In this setting, fan layers communicating with the second inlet may be independent of each other. In some embodiments, the fan layers communicating with the second inlet convey air to the second inlet through separate air ducts, to avoid mixing of air flowing from the fan layers communicating with the second inlet.

In some embodiments, a first position in which the fourth air duct communicates with the second inlet is located at a downstream position of a second position in which the second air duct communicates with the second inlet. A third position in which the third air duct communicates with the second inlet is located between the first position and the second position.

In this setting, air mixing may be implemented for a plurality of times, and an air mixing effect is better, thereby further improving heat cascading between an upstream switch device and a downstream switch device, and ensuring operation performance of the photovoltaic inverter.

In some embodiments, the present disclosure provides a photovoltaic inverter, including a plurality of switch devices and the heat dissipation apparatus. The plurality of switch devices are arranged in multiple rows, and a row direction of the switch devices is perpendicular to an extension direction of a heat dissipation channel in the heat dissipation apparatus.

According to the photovoltaic inverter provided in this embodiment, the heat dissipation apparatus includes at least two stacked fan layers, each fan layer includes at least one fan, the heat dissipation channel in the radiator has a first inlet, and the first inlet communicates with each air exhaust vent in at least one fan layer by using the air duct component. Compared with that fans are arranged along a width direction of the radiator, the at least two fan layers are stacked, which may not be limited by the width of the radiator. More fans can be arranged in a hierarchical stacking manner, and more fans can increase an overall amount of exhausted air, thereby improving a heat dissipation capability of the heat dissipation apparatus. In addition, a plurality of fans arranged along a straight line are included in a related technology. When a quantity of fans and a width of the radiator in this embodiment of the present disclosure are consistent with those in the related technology, due to a hierarchical stacking manner, a quantity of fans in each fan layer decreases compared with a quantity of fans in each fan layer in the related technology. The decrease in the quantity of fans enables a space available to each fan to become larger, so that an air cavity space of each fan can be enlarged. The enlarged air cavity space enables each fan to obtain a larger amount of exhausted air, thereby increasing an overall amount of exhausted air and improving a heat dissipation capability of the heat dissipation apparatus.

In some embodiments, the photovoltaic inverter further includes an inverter cabinet, and the inverter cabinet includes an electrical cavity and a heat dissipation cavity that are isolated from each other. The switch device is disposed in the electrical cavity, the heat dissipation apparatus is disposed in the heat dissipation cavity, and the switch device is arranged directly toward a heat dissipation sheet in the heat dissipation cavity. In this embodiment, cavities are separately disposed isolating from each other. This can facilitate heat dissipation of the switch device, and effectively protect the switch device, thereby ensuring reliability of long-term running.

In some embodiments, the inverter cabinet includes an intermediate partition panel, and the intermediate partition panel separates the inverter cabinet into the heat dissipation cavity and the electrical cavity. A faying surface of the radiator is bonded to the intermediate partition panel. There are two fan layers, and the two fan layers are disposed on the intermediate partition panel and are located at an end of the radiator parallel to the heat dissipation channel. A fan layer close to the intermediate partition panel includes two fans, and a fan layer away from the intermediate partition panel includes one fan. Each fan includes an air intake vent and an air exhaust vent. One interval space is obtained through separation by the fan in the fan layer close to the intermediate partition panel, and two interval spaces are obtained through separation by the fan in the fan layer away from the intermediate partition panel. An extension direction of the interval space is parallel to an extension direction of the heat dissipation channel. Each air intake vent in the fan layer close to the intermediate partition panel communicates with the interval space in the fan layer away from the intermediate partition panel, and the air intake vent in the fan layer away from the intermediate partition panel communicates with the interval space in the fan layer close to the intermediate partition panel.

In addition to the technical problems resolved in the embodiments of the present disclosure described above, the technical features constituting the technical solutions, and the beneficial effects brought by the technical features of the technical solutions, other technical problems that can be resolved by the heat dissipation apparatus and the photovoltaic inverter provided in the embodiments of the present disclosure, other technical features included in the technical solutions, and beneficial effects brought by the technical features are further described in detail in various embodiments.

Figure 1:
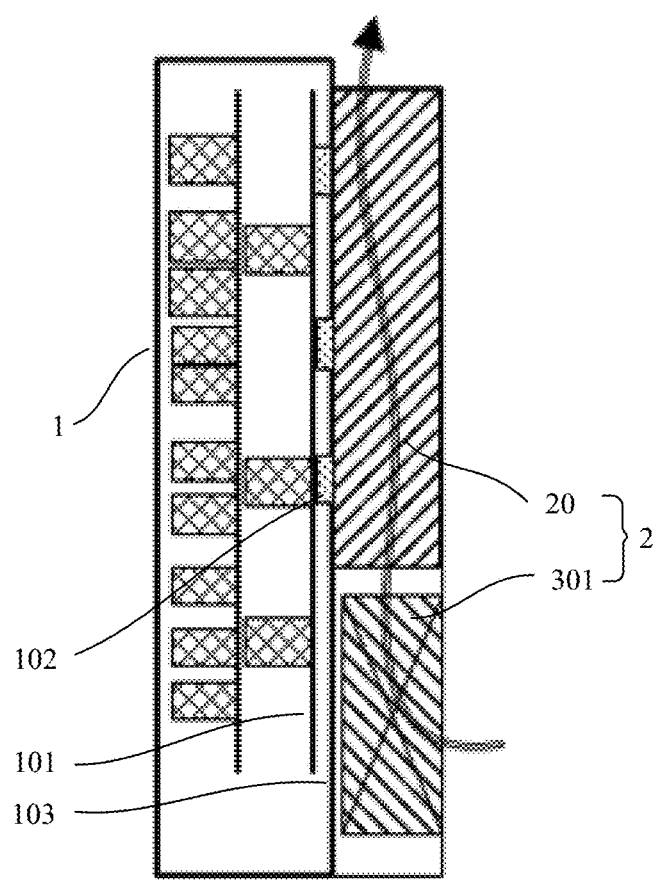
FIG. 1 is a main view of a photovoltaic inverter in a related technology.

DESCRIPTION OF REFERENCE NUMERALS 1. inverter cabinet;
101. circuit board;
102. switch device;
103. intermediate partition panel;
2. heat dissipation apparatus;
20. radiator;
201. heat dissipation sheet;
202. substrate;
2011. first inlet;
2012. second inlet;
2013. front heat dissipation section;
2014. rear heat dissipation section;
30. fan layer;
301. fan;
302. first fan layer;
303. second fan layer;
304. third fan layer;
305. fourth fan layer;
3011. fan box;
3012. centrifugal fan;
3013. air intake vent;
3014. air exhaust vent;
40. interval space;
50. air duct component;
501. air duct;
502. partition panel;
5011. first air duct;
5012. second air duct;
5013. third air duct; and
5014. fourth air duct.

DESCRIPTION OF EMBODIMENTS

To make the foregoing objects, features, and advantages of the embodiments of the present disclosure clearer and easier to understand, the technical solutions in the embodiments of the present disclosure are described below clearly with reference to the accompanying drawings in the embodiments of the present disclosure. It is clear that the described embodiments are merely some but not all of embodiments of the present disclosure. All other embodiments obtained by persons of ordinary skill in the art based on embodiments of the present disclosure without creative efforts shall fall within the protection scope of the present disclosure.

Figure 2:
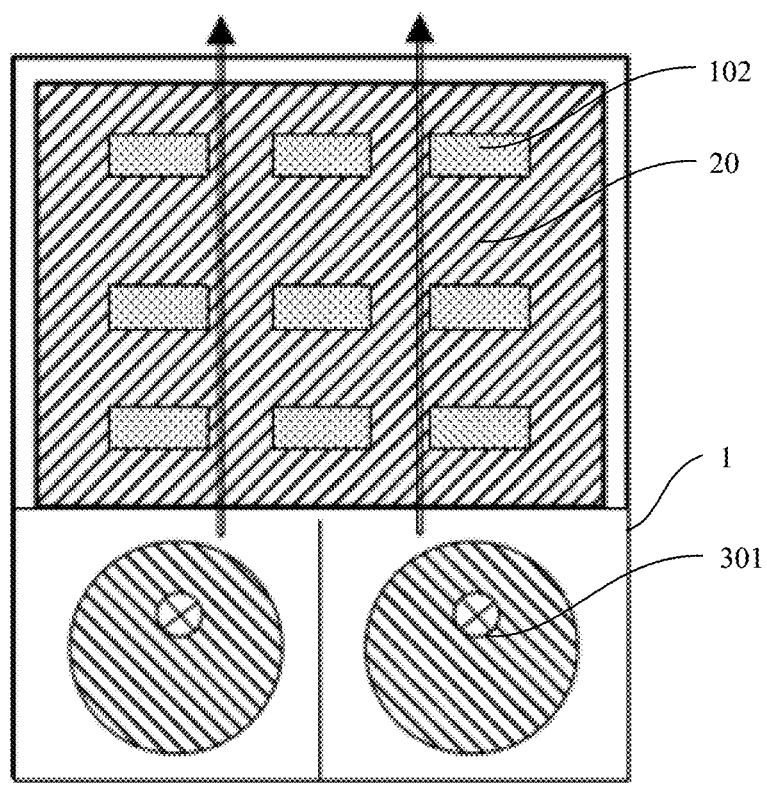
FIG. 2 is a side view of a photovoltaic inverter in a related technology.

A photovoltaic inverter is an inverter that can convert a variable direct current generated by a photovoltaic solar panel into an alternating current with a mains frequency. The converted alternating current may be fed back to a commercial power transmission system, or may be used by an off-the-grid power grid. As shown in FIG. 1 and FIG. 2, in a related technology, a photovoltaic inverter includes an inverter cabinet 1, a circuit board 101, a switch device 102, and a heat dissipation apparatus 2. The switch device 102 may be an insulated gate bipolar transistor (IGBT). An intermediate partition panel 103 is disposed in the inverter cabinet 1. The intermediate partition panel 103 separates the inverter cabinet 1 into an electrical cavity and a heat dissipation cavity that are independent of each other. The switch device 102 is disposed on the circuit board 101. The circuit board 101 is disposed in the electrical cavity. The heat dissipation apparatus 2 is disposed in the heat dissipation cavity. The heat dissipation apparatus 2 includes a radiator 20 and two fans. The radiator 20 includes a substrate and a plurality of heat dissipation sheets vertically mounted on the substrate. The substrate is attached against a side wall that is of the heat dissipation cavity and on which the intermediate partition panel is located. The plurality of heat dissipation sheets are disposed in parallel at intervals. A heat dissipation channel is formed between two adjacent heat dissipation sheets. Both the two fans are disposed at a bottom of the radiator, and the two fans are located in a same plane parallel to the substrate. A line connecting the two fans is perpendicular to the heat dissipation sheets, where the two fans are arranged along a width direction of the radiator 20. During operation, the fan conveys air to the heat dissipation channel. After entering the heat dissipation channel, the air flows through the heat dissipation channel in a direction away from the fan. In the foregoing process, heat is exchanged between the air in the heat dissipation channel and the heat dissipation sheet, to take out heat from the electrical cavity, thereby dissipating heat from the switch device 102 in the electrical cavity.

However, if the fans are arranged in the foregoing manner, in a plane parallel to the substrate, a size along a direction perpendicular to the heat dissipation sheet is limited, that is, a space along the width direction of the radiator 20 is limited. Therefore, a quantity of fans that can be arranged is relatively small, and the relatively small quantity of fans leads to a relatively small overall amount of air exhausted by the heat dissipation apparatus 2. As a result, a heat dissipation capability of the heat dissipation apparatus 2 is restricted.

In view of this, some embodiments of the present disclosure provides a photovoltaic inverter in which a heat dissipation apparatus includes at least two fan layers. The at least two fan layers are stacked along a direction perpendicular to a plane of a substrate, so that a space perpendicular to a substrate direction is fully used. More fans can be arranged in a hierarchical stacking manner, and more fans can increase an overall amount of exhausted air, thereby improving a heat dissipation capability of the heat dissipation apparatus.

Figure 3:
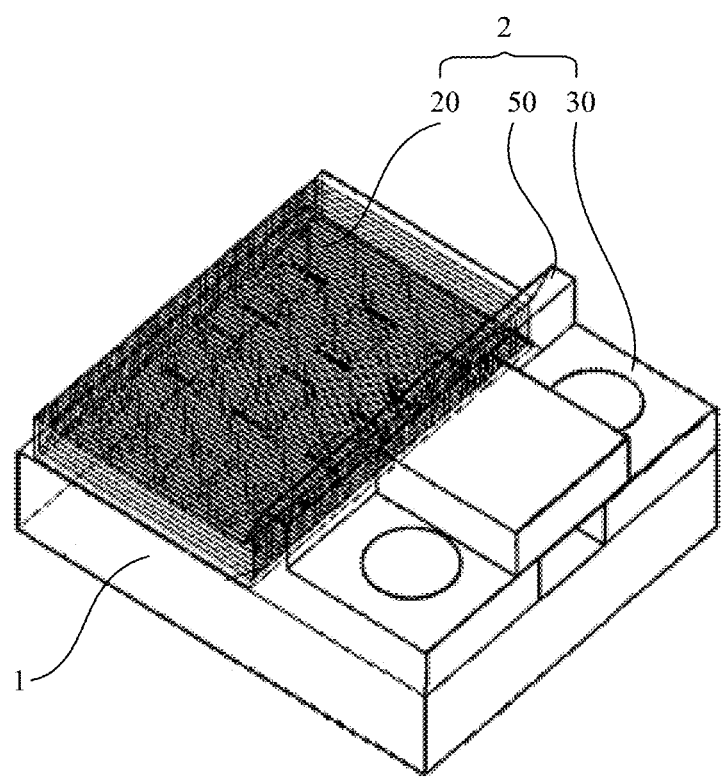
FIG. 3 is a 3D diagram of a photovoltaic inverter according to some embodiments of the present disclosure.
Figure 4:
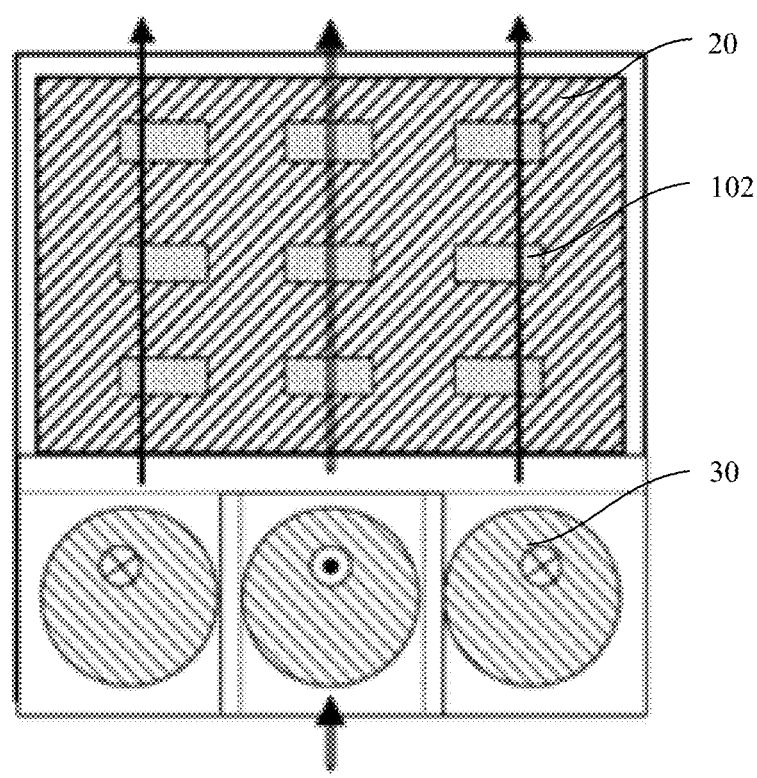
FIG. 4 is a top view 1 of a photovoltaic inverter according to some embodiments of the present disclosure.
Figure 5:
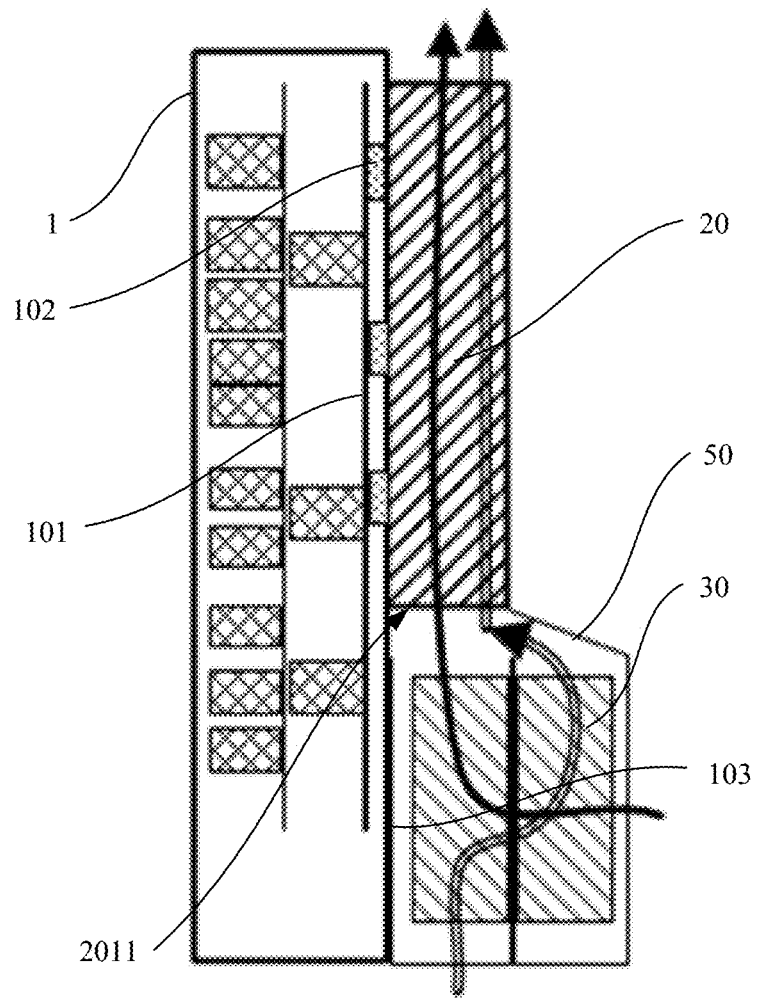
FIG. 5 is a schematic diagram of a structure of a photovoltaic inverter in which a fan is a centrifugal fan according to some embodiments of the present disclosure.

As shown in FIG. 3 to FIG. 5, the photovoltaic inverter includes an inverter cabinet 1. The inverter cabinet 1 may be separated into an independent electrical cavity and heat dissipation cavity by using an intermediate partition panel 103. A circuit board 101 is disposed in the electrical cavity, and a switch device 102 and another electronic device are disposed on the circuit board 101. During operation, the switch device 102 and the other electronic device cooperate with each other to convert a variable direct current generated by a photovoltaic solar panel into an alternating current with a mains frequency. The switch device 102 may be an insulated gate bipolar transistor (IGBT). Certainly, in this embodiment, the switch device 102 may be another element that can cooperate with the electronic device on the circuit board 101 to convert a variable direct current generated by a photovoltaic solar panel into an alternating current with a mains frequency. There may be a plurality of switch devices 102, and the corresponding plurality of switch devices 102 are disposed in an array.

During operation, the switch device 102 generates heat, and the heat generated by the switch device 102 needs to be released to the outside of the inverter cabinet 1 in time, to prevent an excessively higher temperature from affecting operation of the switch device 102 and another electronic device on the circuit board 101. For example, the circuit board 101 may be disposed in parallel to the intermediate partition panel 103, and the circuit board 101 is close to the intermediate partition panel 103, so that heat from the circuit board 101 may enter the heat dissipation cavity by using the intermediate partition panel 103. Further, the switch device 102 is disposed on a side surface that is of the circuit board 101 and that faces the intermediate partition panel 103, so that heat generated by the switch device 102 can quickly enter the heat dissipation cavity by using the intermediate partition panel 103. In this embodiment, a distance between the circuit board 101 and the intermediate partition panel 103 may be appropriately shortened, to improve a speed at which heat enters the heat dissipation cavity. Certainly, in some embodiments, the circuit board 101 or the switch device 102 on the circuit board 101 may be in contact with the intermediate partition panel 103, to further improve the speed at which heat enters the heat dissipation cavity.

Still referring to FIG. 3 and FIG. 5, to release heat entering the heat dissipation cavity to an outside environment, in this embodiment, a heat dissipation apparatus 2 is disposed in the heat dissipation cavity. The heat dissipation apparatus 2 includes a radiator 20, an air duct component 50, and at least two fan layers 30. The radiator 20 is disposed close to the intermediate partition panel 103. Further, a faying surface bonded to the intermediate partition panel 103 may be disposed on the radiator 20, so that heat from the intermediate partition panel 103 can quickly enter the radiator 20. A heat dissipation channel is disposed on the radiator 20, and the at least two fan layers 30 are disposed on a side of the radiator 20, and are located at an end of the heat dissipation channel. An end that is of the heat dissipation channel and that faces each fan layer 30 has a first inlet 2011. At least one fan is disposed in each fan layer 30, and the fan has an air exhaust vent. Each air exhaust vent in the at least one fan layer 30 communicates with the first inlet 2011 by using the air duct component 50. For example, each fan layer 30 may be disposed on the intermediate partition panel 103, and certainly, each fan layer 30 may alternatively be disposed on the radiator 20. During operation, heat from the electrical cavity enters the heat dissipation cavity, and the at least one fan layer 30 conveys air from the outside to the heat dissipation channel through the first inlet 2011. Heat is exchanged between the air and the radiator 20, to release the heat from the electrical cavity to the outside environment, thereby dissipating heat from the electrical cavity. It should be noted that, when the plurality of switch devices 102 are disposed in an array, the plurality of switch devices 102 are arranged in several rows. A row direction of the switch device 102 may be perpendicular to an extension direction of the heat dissipation channel.

In some embodiments, the heat dissipation cavity may be a closed cavity. In this case, a first opening communicating with the air intake vent of each fan and a second opening communicating with an end that is of the heat dissipation channel and that is away from the first inlet 2011 need to be disposed, to ensure that external air can be injected into the heat dissipation channel during operation of the fan, and that air in the heat dissipation channel can be discharged to the outside of the heat dissipation cavity, thereby implementing heat dissipation. Certainly, in another embodiment, the heat dissipation cavity may be an open cavity. In this case, each fan layer 30 and the radiator 20 are exposed to outside air. The fan may directly convey outside air to the heat dissipation channel, and air in the heat dissipation channel may directly be discharged to the outside air.

Figure 10:
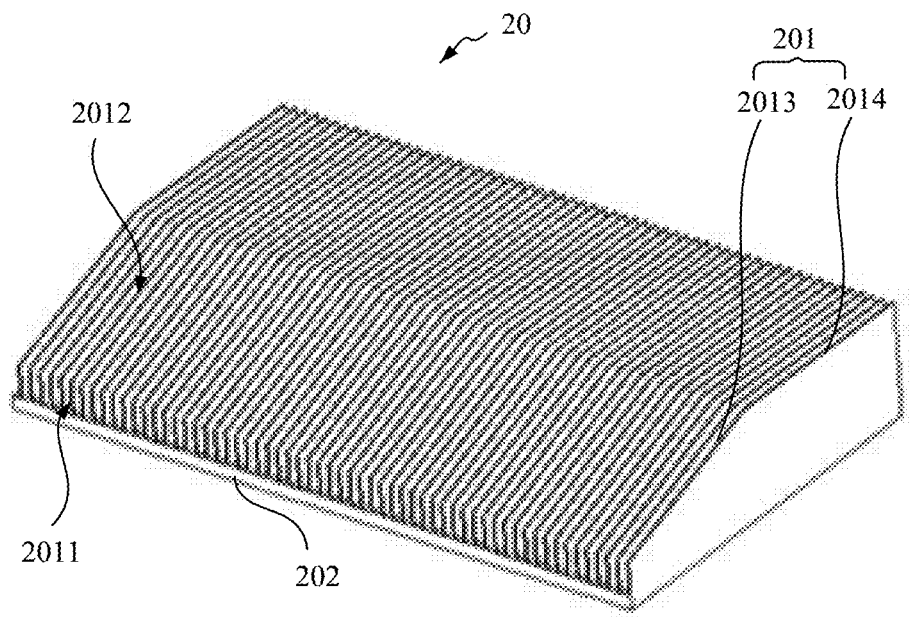
FIG. 10 is a schematic diagram 1 of a structure of a radiator in a photovoltaic inverter according to some embodiments of the present disclosure.

Referring to FIG. 10, the radiator 20 may include a substrate 202 and a plurality of heat dissipation sheets 201 disposed on the substrate 202. The substrate 202 may be disposed parallel to the intermediate partition panel 103. Correspondingly, a faying surface is a side surface that is of the substrate 202 and that faces the intermediate partition panel 103. The heat dissipation sheets 201 are disposed on a side surface that is of the substrate 202 and that is away from the intermediate partition panel 103. The heat dissipation sheets 201 are disposed in parallel at intervals, and a heat dissipation channel is formed between two adjacent heat dissipation sheets 201. During operation, heat from the electrical cavity is transferred to the substrate 202 and each heat dissipation sheet 201. When air flows in the heat dissipation channel, heat is exchanged between the air and each of the heat dissipation sheet 201 and the substrate 202, to transfer heat to the outside environment.

In some embodiments, the substrate 202 may be disposed close to the intermediate partition panel 103, and certainly, the substrate 202 may alternatively be bonded to the intermediate partition panel 103, to improve a speed of transferring heat to the substrate 202 and each heat dissipation sheet 201.

In this embodiment, the at least two fan layers 30 are disposed on the side of the radiator 20. A direction shown in FIG. 3 is used as an example. Each fan layer 30 is disposed facing the first inlet 2011 of the radiator 20, and each fan layer 30 is disposed in a lower part of the radiator 20. Further, each air exhaust vent in the at least one fan layer 30 communicates with the first inlet 2011 by using the air duct component 50. Each air exhaust vent in each fan layer 30 may communicate with the first inlet 2011, or each air exhaust vent in some fan layers 30 communicates with the first inlet 2011.

Figure 7:
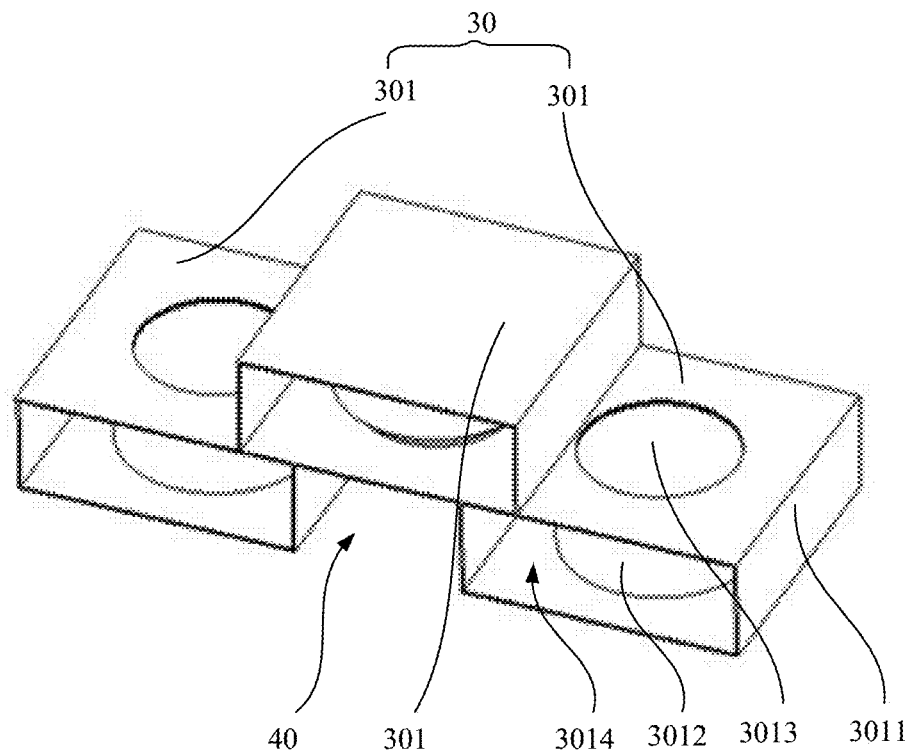
FIG. 7 is a schematic diagram 1 of a structure in which fan layers are stacked in a photovoltaic inverter according to some embodiments of the present disclosure.
Figure 8:
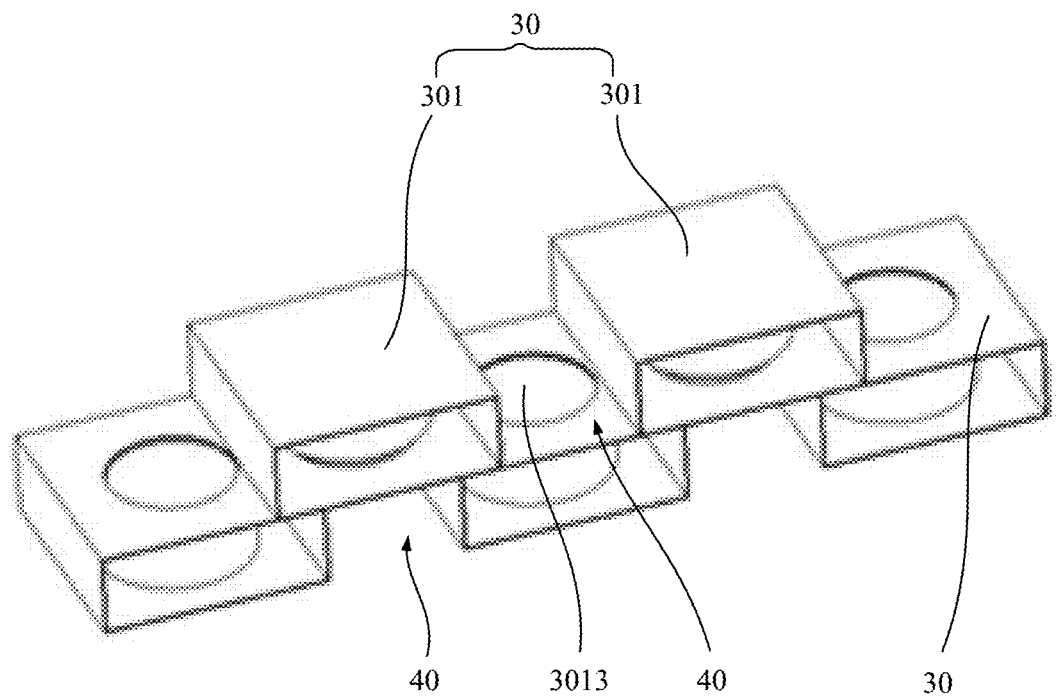
FIG. 8 is a schematic diagram 2 of a structure in which fan layers are stacked in a photovoltaic inverter according to some embodiments of the present disclosure.
Figure 9:
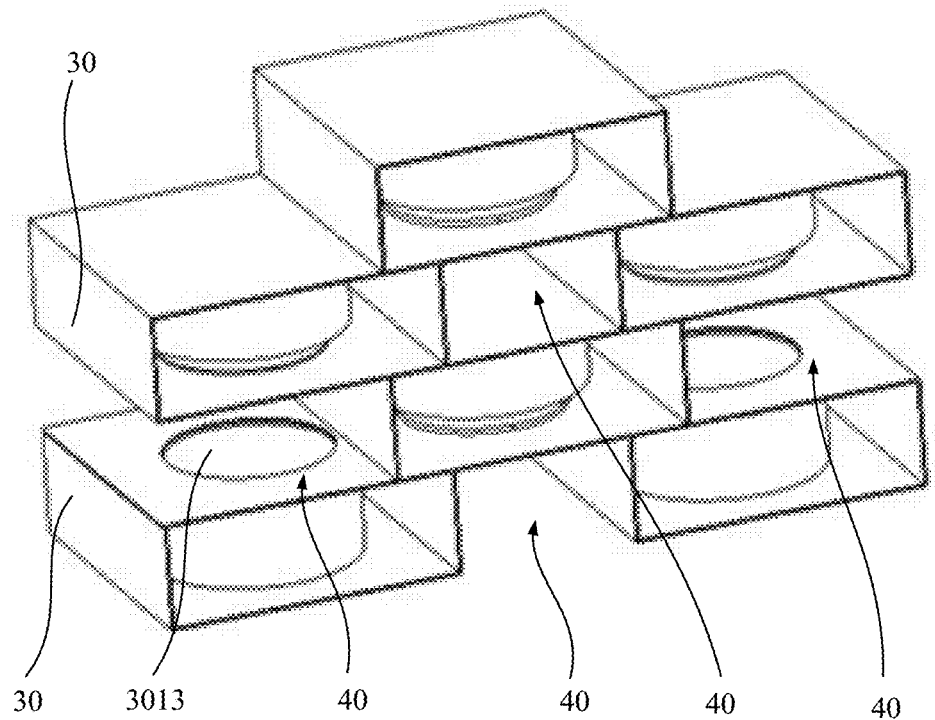
FIG. 9 is a schematic diagram 3 of a structure in which fan layers are stacked in a photovoltaic inverter according to some embodiments of the present disclosure.

Still referring to FIG. 7 to FIG. 9, the fan layers 30 are stacked in a direction perpendicular to the faying surface of the radiator 20, that is, the fan layers 30 are successively stacked along a direction perpendicular to the intermediate partition panel 103. Each fan layer 30 includes at least one fan 301. For example, each fan layer 30 may include one fan 301. Certainly, each fan layer 30 may include a plurality of fans 301. Correspondingly, fans 301 in each fan layer 30 are located in a same plane parallel to the intermediate partition panel 103 and are disposed at intervals along a direction perpendicular to each heat dissipation sheet 201. In other words, the fans 301 in each fan layer 30 are successively arranged along a width direction of the radiator 20.

According to the photovoltaic inverter provided in this embodiment, the heat dissipation apparatus 2 includes at least two stacked fan layers 30, each fan layer 30 includes at least one fan 301, the heat dissipation channel in the radiator 20 has a first inlet 2011, and the first inlet 2011 communicates with each air exhaust vent in at least one fan layer 30 by using the air duct component 50. Compared with that fans 301 are arranged along the width direction of the radiator 20, the at least two fan layers 30 are stacked, which may not be limited by the width of the radiator 20. More fans 301 can be arranged in a hierarchical stacking manner, and more fans 301 can increase an overall amount of exhausted air, thereby improving a heat dissipation capability of the heat dissipation apparatus 2. In addition, a plurality of fans 301 arranged along a straight line are included in a related technology. When a quantity of fans 301 and a width of the radiator 20 in this embodiment of the present disclosure are consistent with those in the related technology, due to a hierarchical stacking manner, a quantity of fans 301 in each fan layer 30 decreases compared with a quantity of fans 301 in each fan layer 30 in the related technology. The decrease in the quantity of fans 301 enables a space available to each fan 301 to become larger, so that an air cavity space of each fan 301 can be enlarged. The enlarged air cavity space enables each fan 301 to obtain a larger amount of exhausted air, thereby increasing an overall amount of exhausted air and improving a heat dissipation capability of the heat dissipation apparatus 2.

Still referring to FIG. 7 to FIG. 9, in the foregoing embodiment, at least one interval space 40 is obtained in each fan layer 30 through separation by the fan 301 in the fan layer 30. In two adjacent fans 301, an air intake vent 3013 in inner fan layer 30 communicates with the interval space 40 in an outer fan layer 30. In other words, in the two adjacent fan layers 30, air from the inner fan layer 30 enters through the interval space 40 in the outer fan layer 30, and correspondingly, air from the outer fan layer 30 enters through the interval space 40 in the inner fan layer 30. In this setting, a separate air intake area does not need to be added outside the fan layer 30, and a volume occupied by a plurality of fan layers 30 is not additionally added, thereby facilitating air intake of a fan in each fan layer 30.

It should be noted that the inner fan layer 30 may be one of the two adjacent fan layers 30 that is close to an intermediate partition panel 103.

Further, in the two adjacent fan layers 30, the air intake vent 3013 in the inner layer fan layer 30 is located in projection that is of the interval space 40 in outer fan layer 30 and that is in the inner fan layer 30. In this setting, it can be ensured that the air intake vent 3013 in the inner fan layer 30 can directly face the interval space 40 in the outer fan layer 30, and air can directly enter the air intake vent 3013 in the inner fan layer 30 through the interval space 40. This can reduce resistance generated when air flows from the interval space 40 to the air intake vent 3013, and prevent a tortuous path through which the air flows from the interval space 40 to the air intake vent 3013 in the inner fan layer 30. For example, the air intake vent 3013 in the inner the fan layer 30 may completely overlap the projection that is of the interval space 40 in the outer fan layer 30 and that is in the inner fan layer 30. Certainly, the air intake vent 3013 in the inner fan layer 30 may be located inside the projection that is of the interval space 40 in the outer fan layer 30 and that is in the inner fan layer 30.

Similarly, the air intake vent 3013 in the outer fan layer 30 is located inside projection that is of the interval space 40 in the inner fan layer 30 and that is in the outer fan layer 30. For example, the air intake vent 3013 in the outer fan layer 30 may completely overlap the projection that is of the interval space 40 in the inner fan layer 30 and that is in the outer fan layer 30. Certainly, the air intake vent 3013 in the outer fan layer 30 may be located inside the projection that is of the interval space 40 in the inner fan layer 30 and that is in the outer fan layer 30.

In this embodiment, in two adjacent fan layers 30, a quantity of interval spaces 40 in the inner fan layer 30 is the same as a quantity of air intake vents 3013 in the outer fan layer 30, and the interval spaces 40 in the inner fan layer 30 are in a one-to-one correspondence with the air intake vents 3013 in the outer fan layer 30. Correspondingly, a quantity of interval spaces 40 in the outer fan layer 30 is the same as a quantity of air intake vents 3013 in the inner fan layer 30, and the interval spaces 40 in the outer fan layer 30 are in a one-to-one correspondence with the air intake vents 3013 in the inner fan layer 30.

For example, as shown in FIG. 7, the inner fan layer 30 may include two fans 301, and the inner fan layer 30 includes one interval space 40. Correspondingly, the outer fan layer 30 includes one fan 301, and the outer fan layer 30 includes two interval spaces 40. In this case, one air intake vent 3013 in the inner fan layer 30 directly faces one interval space 40 in the outer fan layer 30, and the other air intake vent 3013 in the inner fan layer 30 directly faces the other interval space 40 in the outer fan layer 30. Correspondingly, the air intake vent 3013 in the outer fan layer 30 directly faces the interval space 40 in the inner fan layer 30.

Still referring to FIG. 3 and FIG. 7, the inverter cabinet 1 includes an intermediate partition panel 103, and the intermediate partition panel 103 separates the inverter cabinet 1 into the heat dissipation cavity and the electrical cavity. A faying surface of the radiator 20 is bonded to the intermediate partition panel 103. There are two fan layers 30, and the two fan layers 30 are disposed on the intermediate partition panel 103 and are located at an end of the radiator 20 parallel to the heat dissipation channel. A fan layer 30 close to the intermediate partition panel 103 includes two fans 301, and a fan layer 30 away from the intermediate partition panel 103 includes one fan 301. Each fan 301 includes an air intake vent 3013 and an air exhaust vent 3014. One interval space 40 is obtained through separation by the fan 301 in the fan layer 30 close to the intermediate partition panel 103, and two interval spaces 40 are obtained through separation by the fan 301 in the fan layer 30 away from the intermediate partition panel 103. An extension direction of the interval space 40 is parallel to an extension direction of the heat dissipation channel. Each air intake vent 3013 in the fan layer 30 close to the intermediate partition panel 103 communicates with the interval space 40 in the fan layer 30 away from the intermediate partition panel 103, and the air intake vent 3013 in the fan layer 30 away from the intermediate partition panel 103 communicates with the interval space 40 in the fan layer 30 close to the intermediate partition panel 103.

In some embodiments, as shown in FIG. 8, a quantity of fans 301 in the inner fan layer 30 may alternatively be three. Correspondingly, the inner fan layer 30 has two interval spaces 40, the outer fan layer 30 may have two fans 301, and the outer fan layer 30 has three interval spaces 40. In this case, the air intake vents 3013 in the outer fan layer 30 are in a one-to-one correspondence with the interval spaces 40 in the inner fan layer 30. Similarly, the interval spaces 40 in the outer fan layer 30 are in a one-to-one correspondence with the air intake vents 3013 in the inner fan layer 30.

In this embodiment, a quantity of fan layers 30 is not limited to two, and the quantity of fan layers 30 may further be three, four, or the like. A quantity of fans 301 in the fan layer 30 may be four, five, or the like. Correspondingly, a correspondence between the interval space 40 and the air intake vent 3013 is basically the same as that in the foregoing embodiment, and details are not described herein again.

Still referring to FIG. 5 and FIG. 7 to FIG. 9, in the foregoing embodiment, the fan 301 may be a centrifugal fan. Correspondingly, the fan 301 may include a fan box 3011 and a centrifugal fan 3012. The fan box 3011 forms an air cavity. The air intake vent 3013 is disposed on the fan box 3011. The air exhaust vent 3014 that directly faces the radiator 20 is further disposed on the fan box 3011. A central line of the air intake vent 3013 is set perpendicular to a central line of the air exhaust vent 3014, so that an opening direction of the air intake vent 3013 is perpendicular to an opening direction of the air exhaust vent 3014. When the centrifugal fan 3012 operates, air is sucked into the air cavity through the air intake vent 3013, and then the air is discharged from the air exhaust vent 3014 to flow into the heat dissipation channel. In this embodiment, the centrifugal fan is used. A relatively common axial flow fan has advantages such as a large air amount and press head, good performance, and low costs.

For example, the fan box 3011 may be a cuboid box. Correspondingly, the air intake vent 3013 and the air exhaust vent 3014 are respectively disposed on two adjacent side surfaces of the fan box 3011, to ensure that the central line of the air intake vent 3013 is perpendicular to the central line of the air exhaust vent 3014. This setting manner is simple and easy to implement. Certainly, in some embodiments, the fan box 3011 may be in another shape, provided that the central line of the air intake vent 3013 is perpendicular to the central line of the air exhaust vent 3014.

Figure 6:
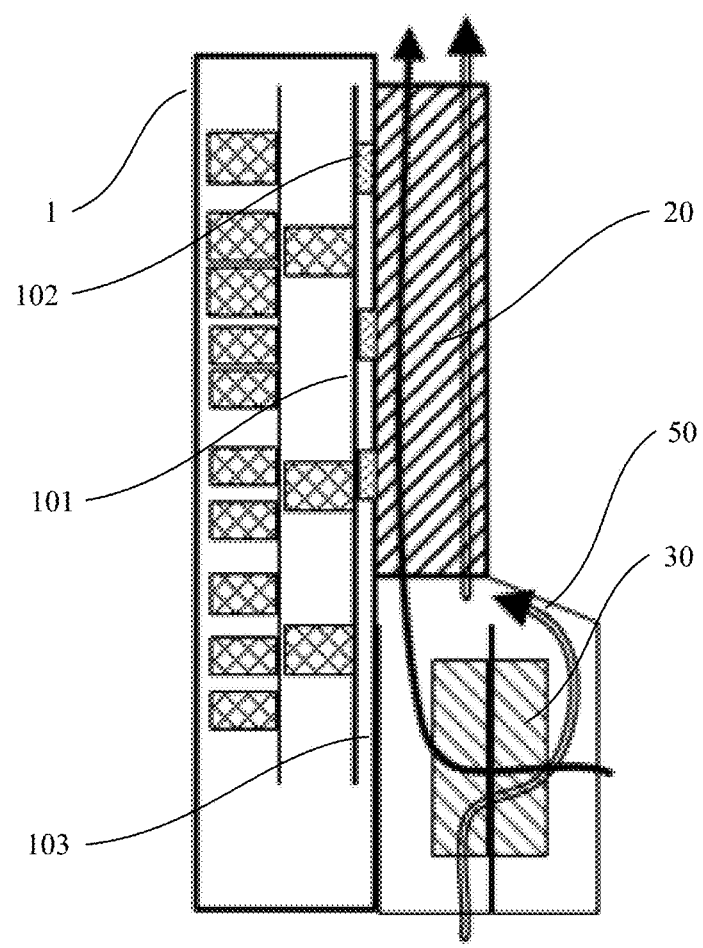
FIG. 6 is a schematic diagram of a structure of a photovoltaic inverter in which a fan is an axial flow fan according to some embodiments of the present disclosure.

As shown in FIG. 6, in some embodiments, a fan in the fan layer 30 may be an axial flow fan. Correspondingly, the fan includes a fan box and an axial flow fan. The fan box forms an air cavity. An air intake vent and an air exhaust vent are disposed on the fan box, and center lines of both the air intake vent and the air exhaust vent are parallel to an axis of the axial flow fan.

Figure 11:
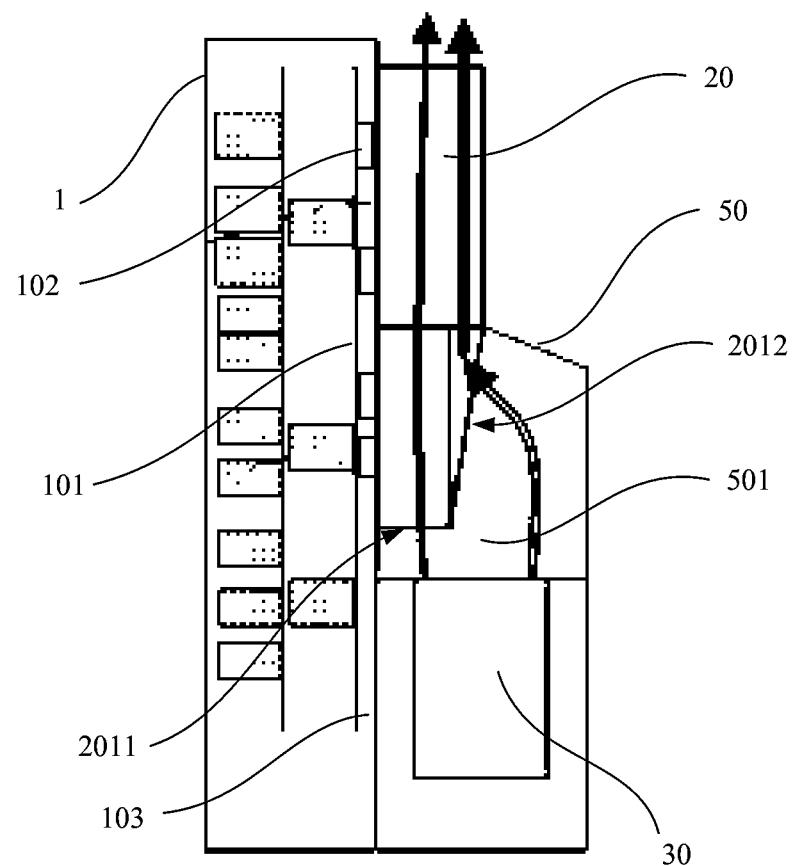
FIG. 11 is a diagram 1 of an internal structure of a photovoltaic inverter in which a heat dissipation sheet whose height of a front heat dissipation section gradually increases to a height the same as that of a rear heat dissipation section according to some embodiments of the present disclosure.

Still referring to FIG. 10 and FIG. 11, in this embodiment, a second inlet 2012 is further disposed on the radiator 20, the second inlet 2012 is located in a downstream position of the first inlet 2011, and the second inlet 2012 communicates with each air exhaust vent 3014 in at least one fan layer 30 by using the air duct component 50. In other words, one part of the fan layers 30 communicates with the first inlet 2011 by using the air duct component 50, and the other part of the fan layers 30 communicates with the second inlet 2012 by using the air duct component 50. In this setting, air flowing from one part of the fan layers 30 enters the heat dissipation channel from the first inlet 2011 by using the air duct component 50, and air flowing from the other part of the fan layers 30 enters the heat dissipation channel from the second inlet 2012 by using the air duct component 50. The first inlet 2011 is located in an upstream position of the heat dissipation channel relative to the second inlet 2012. Therefore, heat is first exchanged between the air entering the heat dissipation channel from the first inlet 2011 and the radiator 20 located between the first inlet 2011 and the second inlet 2012, and a temperature of an air flow increases after the heat exchange, to form hot air. After reaching a position of the second inlet 2012, the hot air meets the air entering from the second inlet 2012. A temperature of the air entering from the second inlet 2012 is relatively low, and the air with the relatively low temperature is mixed with the hot air, to implement a mixture of cold and hot air. Therefore, a temperature of the hot air in the heat dissipation channel is reduced, thereby reducing impact made on the second inlet 2012 and a radiator 20 located at a downstream position of the second inlet 2012 by the radiator 20 located between the first inlet 2011 and the second inlet 2012, alleviating heat cascading between an upstream switch device 102 corresponding to an upstream radiator 20 of the second inlet 2012 and a downstream switch device 102 corresponding to a downstream radiator 20 of the second inlet 2012, and ensuring operation performance of the photovoltaic inverter.

In an embodiment in which the radiator 20 includes a substrate 202 and a plurality of heat dissipation sheets 201 vertically mounted on the substrate 202, a heat dissipation channel is formed between two adjacent heat dissipation sheets 201, an end opening formed at ends that are of two adjacent heat dissipation sheets 201 and that face each fan layer 30 is the first inlet 2011, and a top opening formed at tops that are of every two adjacent heat dissipation sheets 201 and that are away from the top of the substrate 202 is the second inlet 2012. In other words, the ends that are of the two adjacent heat dissipation sheets 201 and that face each fan layer 30 form the first inlet 2011, and ends that are of the two adjacent heat dissipation sheets 201 and that are away from the top of the substrate 202 form the second inlet 2012. In this setting, a structure is simple and easy to process.

Further, each heat dissipation sheet 201 includes a front heat dissipation section 2013 and a rear heat dissipation section 2014, and the front heat dissipation section 2013 is closer to the first inlet 2011 than the rear heat dissipation section 2014. A top opening formed at tops of every two adjacent front heat dissipation sections 2013 is the second inlet 2012. A height of the front heat dissipation section 2013 relative to the substrate 202 is not higher than a height of the rear heat dissipation section 2014 relative to the substrate 202.

In this setting, when the height of the front heat dissipation section 2013 relative to the substrate 202 is lower than the height of the rear heat dissipation section 2014 relative to the substrate 202, air entering from the second inlet 2012 may relatively easily enter a bottom position that is of the rear heat dissipation section 2014 and that is close to the substrate 202, so that the air entering the heat dissipation channel from the second inlet 2012 and hot air that is in the heat dissipation channel and that flows from the first inlet 2011 into the bottom position are in sufficient contact, to implement sufficient heat exchange, thereby improving an air mixing effect, further alleviating heat cascading between an upstream switch device 102 and a downstream switch device 102, and ensuring operation performance of the photovoltaic inverter.

Still referring to FIG. 10 and FIG. 11, in some embodiments, along a direction from the front heat dissipation section 2013 to the rear heat dissipation section 2014, a height of the front heat dissipation section 2013 relative to the substrate 202 gradually increases to a height the same as that of the rear heat dissipation section 2014. In this setting, along a direction from the front heat dissipation section 2013 to the rear heat dissipation section 2014, the top of the front heat dissipation section 2013 is an inclined plane whose front is low and rear is high. In some embodiments, air entering from the second inlet 2012 may more easily enter a bottom position that is of the rear heat dissipation section 2014 and that is close to the substrate 202, so that the air entering the heat dissipation channel from the second inlet 2012 and air that is in the heat dissipation channel and that flows from the first inlet 2011 into the bottom position are in sufficient contact, to implement sufficient heat exchange, thereby improving an air mixing effect, further alleviating heat cascading between an upstream switch device 102 and a downstream switch device 102, and ensuring operation performance of the photovoltaic inverter.

Figure 13:
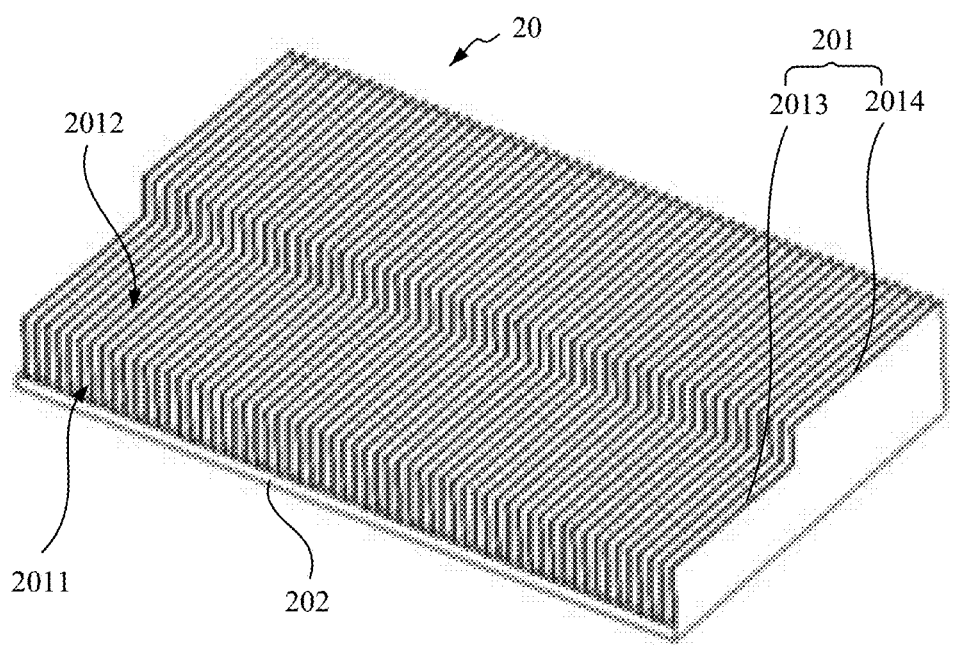
FIG. 13 is a schematic diagram 2 of a structure of a radiator in a photovoltaic inverter according to some embodiments of the present disclosure.
Figure 14:
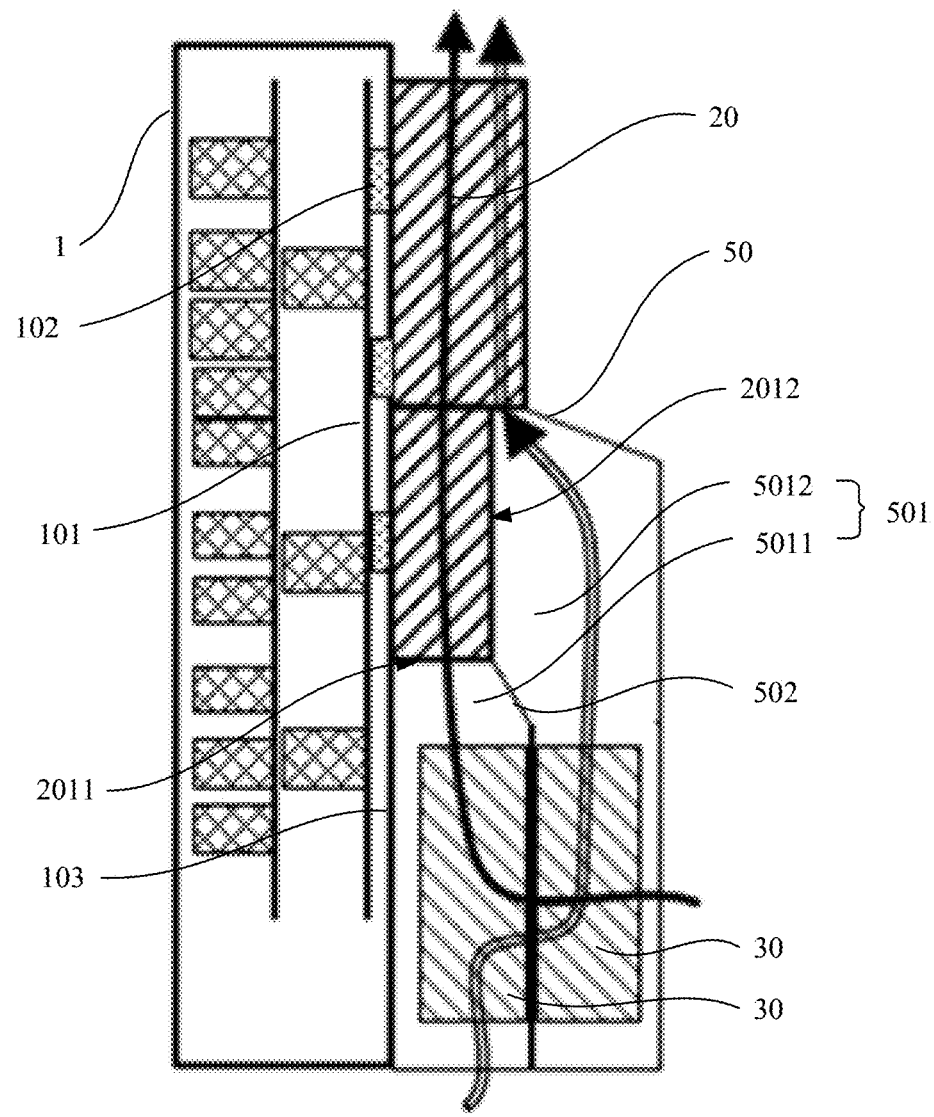
FIG. 14 is a diagram 1 of an internal structure of a photovoltaic inverter in which a heat dissipation sheet whose front heat dissipation section and rear heat dissipation section are in a step-like structure according to some embodiments of the present disclosure.
Figure 15:
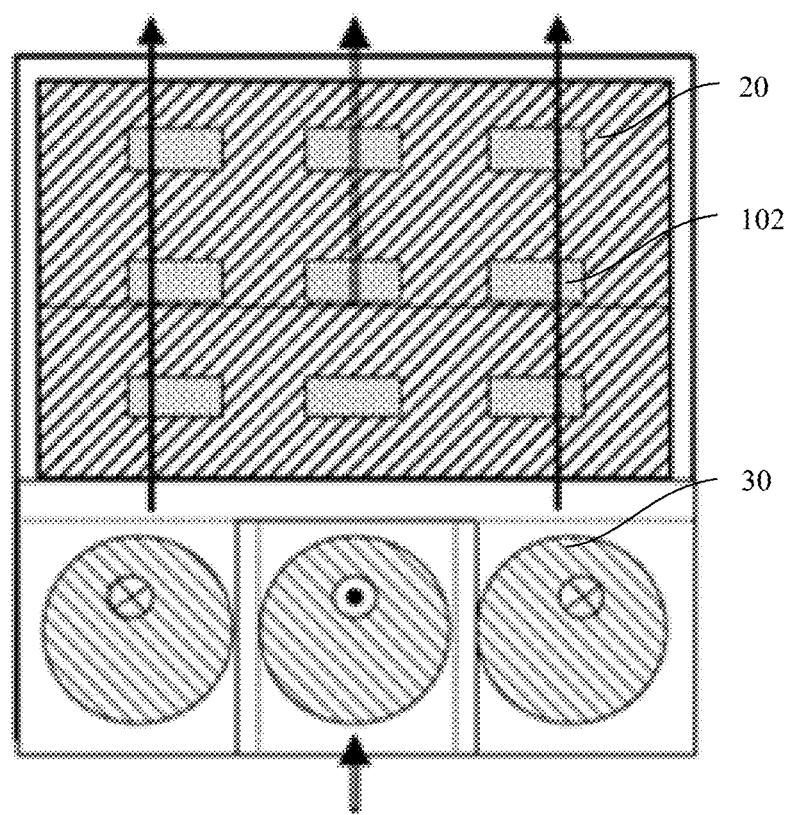
FIG. 15 is a top view 2 of a photovoltaic inverter according to some embodiments of the present disclosure.

Still referring to FIG. 13 to FIG. 15, in another embodiment, the front heat dissipation section 2013 and the rear heat dissipation section 2014 may constitute a step-like structure. In some embodiments, a height of the front heat dissipation section 2013 is lower than a height of the rear heat dissipation section 2014, and heights of the front heat dissipation sections 2013 are the same along an extension direction of the heat dissipation sheet 201. During operation, a part of the fan layers 30 conveys air to the heat dissipation channel through the first inlet 2011, and the rest of the fan layers 30 conveys air to the heat dissipation channel through the second inlet 2012 and an end that is of the rear heat dissipation section 2014 and that faces the front heat dissipation section 2013.

Still referring to FIG. 11 and FIG. 14, in this embodiment, the air duct component 50 may be formed by a top panel and side panels disposed surrounding the top panel. The top panel and the side panels form an air duct 501. The air exhaust vent 3014 of each fan 301 in one part of the fan layers 30 communicates with the first inlet 2011 through the air duct 501, and the air exhaust vent 3014 of each fan 301 in the other part of the fan layers 30 communicates with the second inlet 2012 through the air duct 501. In this setting, the air exhaust vent 3014, the first inlet 2011, and the second inlet 2012 communicate with a same air duct component 50, that is, one air duct component 50 can be used to provide air for the first inlet 2011 and the second inlet 2012. This structure is simple and easy to implement.

Further, the air duct component 50 formed by the top panel and the side panels covers the radiator 20 and each fan layer 30, to form the air duct 501 between the radiator 20 and each fan layer 30. Air flowing from a part of the fan layers 30 close to the intermediate partition panel 103 enters the first inlet 2011 through the air duct 501. Because a distance between the rest of the fan layers 30 and the intermediate partition panel 103 is relatively long in a direction perpendicular to the intermediate partition panel 103, air flowing from this part of the fan layers 30 enters the second inlet 2012 through the air duct 501. For example, the heat dissipation apparatus 2 includes two fan layers 30. Air flowing from a fan layer 30 close to the intermediate partition panel 103 enters the first inlet 2011 through the air duct 501, and air flowing from the other fan layer 30 enters the second inlet 2012 through the air duct 501. Certainly, in another embodiment, there may be a plurality of fan layers 30. In this case, air flowing from one or more fan layers 30 close to the intermediate partition panel 103 enters the first inlet 2011 through the air duct 501, and air flowing from the rest of the fan layers 30 enters the second inlet 2012 through the air duct 501.

Figure 12:
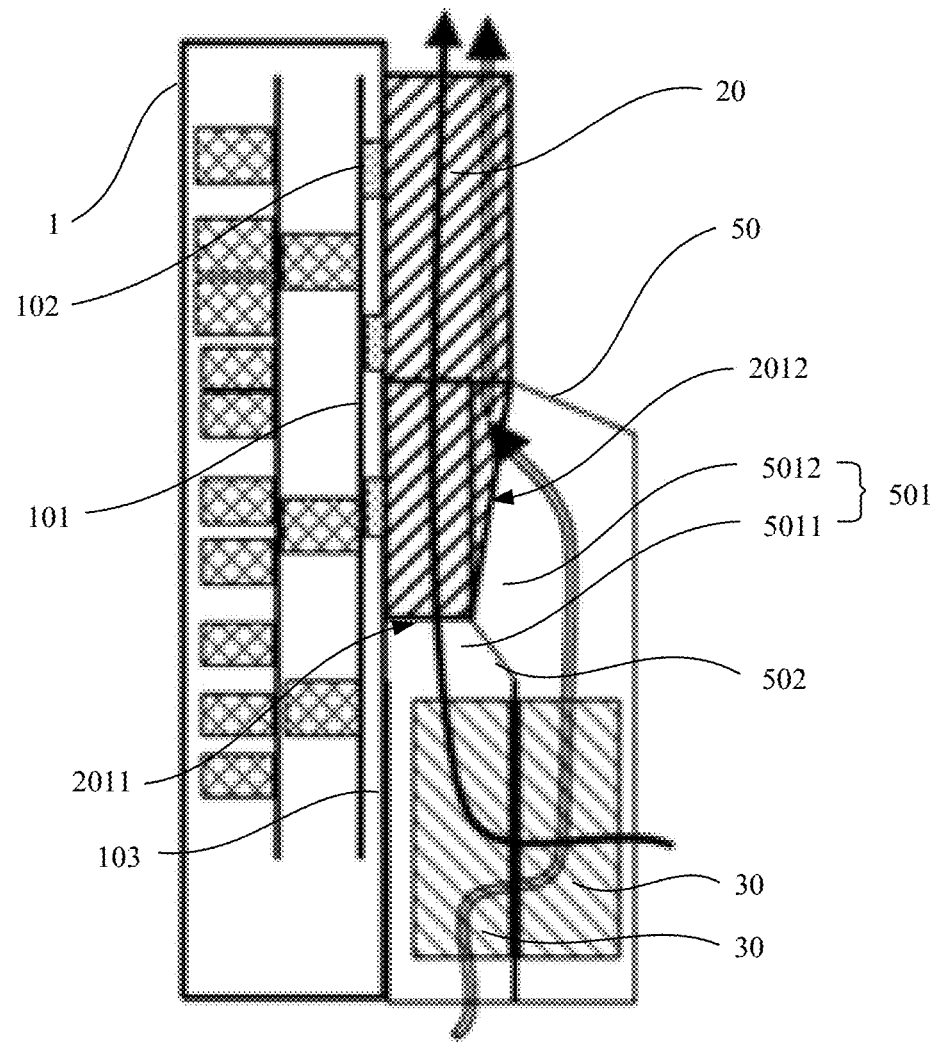
FIG. 12 is a diagram 2 of an internal structure of a photovoltaic inverter in which a heat dissipation sheet whose height of a front heat dissipation section gradually increases to a height the same as that of a rear heat dissipation section according to some embodiments of the present disclosure.

Still referring to FIG. 12 and FIG. 14, further, to avoid mixing, in the air duct 501, of air flowing from a fan layer 30 communicating with the first inlet 2011 and air flowing from another fan layers 30, a partition panel 502 may be disposed in the air duct 501.

For example, in an embodiment in which the heat dissipation apparatus 2 includes two fan layers 30, the two fan layers 30 are respectively a first fan layer located in an inner layer and a second fan layer located in an outer layer. One end of the partition panel 502 is connected to the radiator 20, and the other end of the partition panel 502 extends to a contact area between the first fan layer and the second fan layer. The partition panel 502 separates the air duct 501 into a first air duct and a second air duct. One end of the first air duct communicates with the air exhaust vent 3014 of each fan in the first fan layer, and the other end of the first air duct 5011 communicates with the first inlet 2011. One end of the second air duct communicates with the air exhaust vent 3014 of each fan 301 in the second fan layer, and the other end of the second air duct communicates with the second inlet 2012. In this setting, each fan 301 in the first fan layer conveys air to the first inlet 2011 through the first air duct, each fan 301 in the second fan layer conveys air to the second inlet 2012 through the second air duct, and air flowing from the first fan layer is not mixed with air flowing from the second fan layer.

Figure 16:
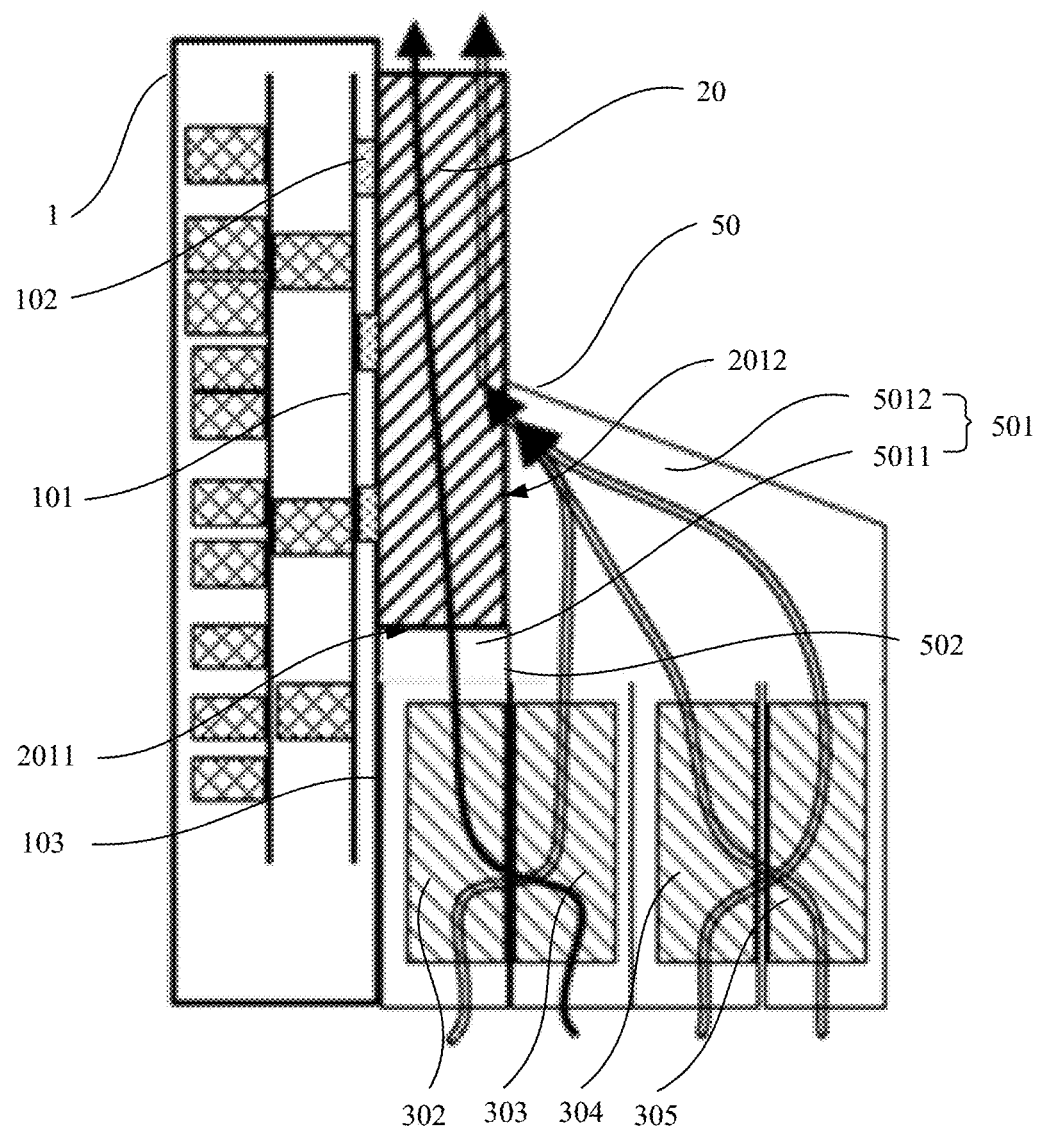
FIG. 16 is a schematic diagram 1 of a structure of a photovoltaic inverter with four fan layers according to some embodiments of the present disclosure.

Still referring to FIG. 16, in an embodiment in which the heat dissipation apparatus 2 includes four fan layers 30 successively stacked, the four fan layers 30 are successively a first fan layer 302, a second fan layer 303, a third fan layer 304, and a fourth fan layer 305 from an inner layer to an outer layer. The air duct component 50 includes a partition panel 502 disposed in the air duct 501. The partition panel 502 separates the air duct 501 into a first air duct 5011 and a second air duct 5012. The first inlet 2011 communicates with each air exhaust vent 3014 in the first fan layer 302 through the first air duct 5011, and the second inlet 2012 communicates with each air exhaust vent 3014 in the second fan layer 303, the third fan layer 304, and the fourth fan layer 305 through the second air duct 5012.

In this setting, air flowing from the first fan layer 302 enters the first inlet 2011 through the first air duct 5011, and air flowing from the second fan layer 303, the third fan layer 304, and the fourth fan layer 305 enters the second inlet 2012 through the second air duct 5012. An air flow quantity of the second inlet 2012 is greater than an air flow quantity of the first inlet 2011, thereby improving an air mixing effect, further alleviating heat cascading between an upstream switch device 102 and a downstream switch device 102, and ensuring operation performance of the photovoltaic inverter.

Figure 17:
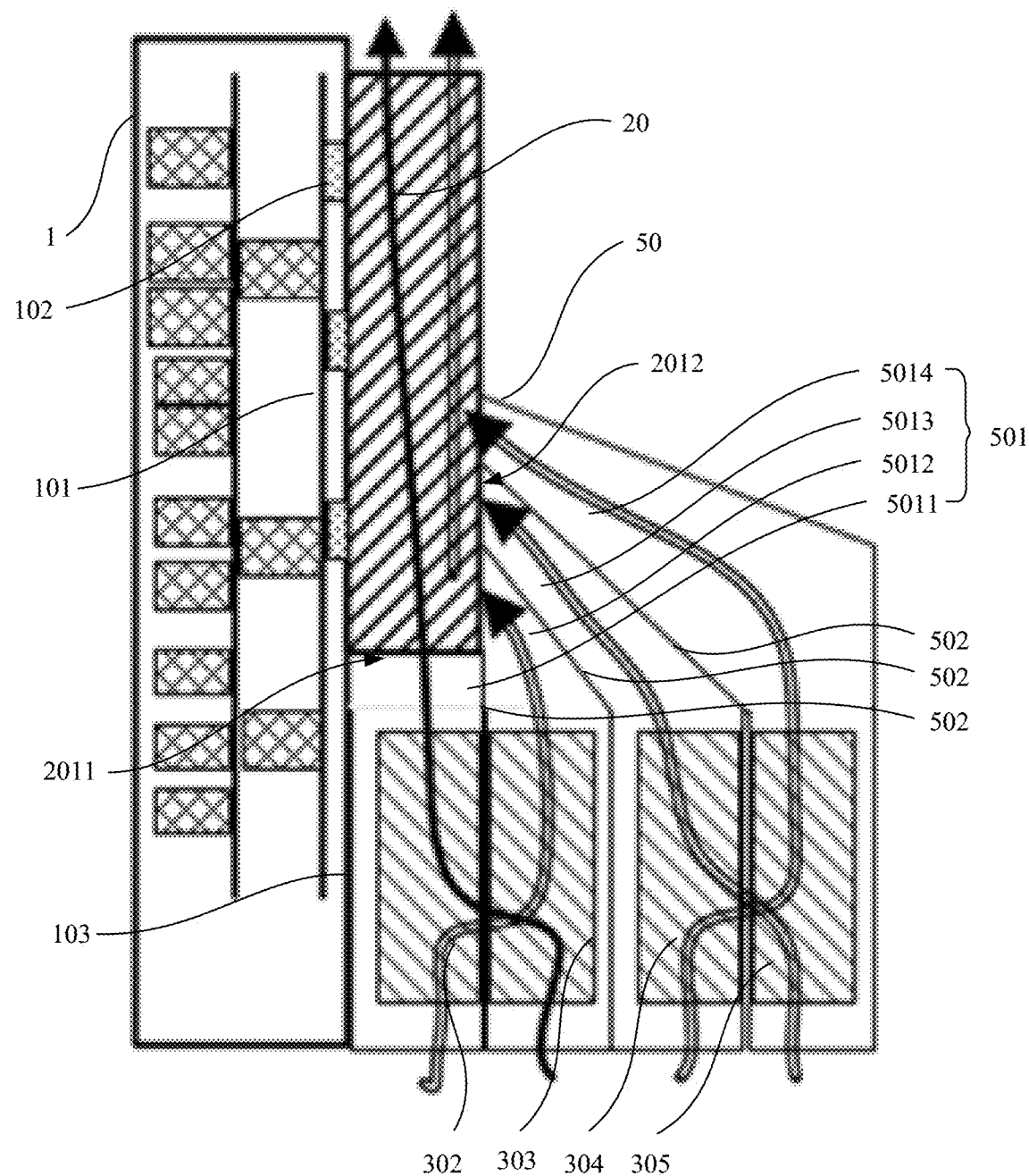
FIG. 17 is a schematic diagram 2 of a structure of a photovoltaic inverter with four fan layers according to some embodiments of the present disclosure.

Still referring to FIG. 17, in another embodiment, when the heat dissipation apparatus 2 includes four fan layers 30 successively stacked, the four fan layers 30 are successively a first fan layer 302, a second fan layer 303, a third fan layer 304, and a fourth fan layer 305 from an inner layer to an outer layer. The air duct component 50 includes three partition panels 502 disposed in the air duct 501. The three partition panels 502 separate the air duct 501 into a first air duct 5011, a second air duct 5012, a third air duct 5013, and a fourth air duct 5014. The first inlet 2011 communicates with each air exhaust vent 3014 in the first fan layer 302 through the first air duct 5011. The second inlet 2012 communicates with each air exhaust vent 3014 in the second fan layer 303 through the second air duct 5012. The second inlet 2012 communicates with each air exhaust vent 3014 in the third fan layer 304 through the third air duct 5013. The second inlet 2012 communicates with each air exhaust vent 3014 in the fourth fan layer 305 through the fourth air duct 5014.

In this setting, fan layers 30 communicating with the second inlet 2012 may be independent of each other. In some embodiments, the fan layers 30 communicating with the second inlet 2012 convey air to the second inlet 2012 through separate air ducts, to avoid mixing of air flowing from the fan layers 30 communicating with the second inlet 2012.

Further, a first position in which the fourth air duct 5014 communicates with the second inlet 2012 is located at a downstream position of a second position in which the second air duct 5012 communicates with the second inlet 2012. A third position in which the third air duct 5013 communicates with the second inlet 2012 is located between the first position and the second position. In this setting, air mixing may be implemented for a plurality of times, and an air mixing effect is better, thereby further improving heat cascading between an upstream switch device 102 and a downstream switch device 102, and ensuring operation performance of the photovoltaic inverter.

In the description of this specification, descriptions of the reference terms "one embodiment", "some embodiment", "example embodiment", "example", "specific example", or "some examples" mean that a characteristic, structure, material, or feature described with reference to an embodiment or an example is included in at least one embodiment or example in the present disclosure. In this specification, example descriptions of the foregoing terms do not necessarily refer to a same embodiment or a same example. Further, characteristics, structures, materials, or features that are described may be incorporated in an appropriate manner in any one or more of embodiments or examples.

Finally, it should be noted that the foregoing embodiments are merely intended for describing the technical solutions of the present disclosure other than limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of embodiments of the present disclosure.

What is claimed is:

1. A heat dissipation apparatus, comprising:
a radiator comprising a heat dissipation channel;
an air duct component; and
at least two fan layers, wherein the at least two fan layers are stacked in a direction perpendicular to a faying surface of the radiator, each fan layer comprises at least one fan, the at least one fan comprises an air exhaust vent, the heat dissipation channel comprises a first inlet that faces at least one of the fan layers, the first inlet communicates with each air exhaust vent in the at least one fan layer by using the air duct component, and in two adjacent fan layers, an air intake vent of the at least one fan in an inner fan layer communicates with at least one interval space in an outer fan layer.

2. The heat dissipation apparatus according to claim 1, wherein:
the at least one fan further comprises the air intake vent and the at least one interval space obtained in each of the fan layers through separation by the at least one fan from an adjacent fan in the at least one fan layer.

3. The heat dissipation apparatus according to claim 2, wherein:
in the two adjacent fan layers, the air intake vent in the inner fan layer is located in projection that is of the interval space in the outer fan layer and that is on the inner fan layer; and
the air intake vent in the outer fan layer is located in projection that is of the interval space in the inner fan layer and that is on the outer fan layer.

4. The heat dissipation apparatus according to claim 1, wherein the fan further comprises:
a fan box comprising an air cavity, the air intake vent, and the air exhaust vent, wherein the air intake vent and the air exhaust vent communicate with the air cavity, and wherein an air flow direction of the air intake vent is perpendicular to an air flow direction of the air exhaust vent; and
a centrifugal fan disposed in the air cavity.

5. The heat dissipation apparatus according to claim 4, wherein the fan box is a cuboid box, and the air intake vent and the air exhaust vent are respectively disposed on two adjacent side surfaces of the fan box.

6. The heat dissipation apparatus according to claim 1, wherein the radiator comprises a second inlet communicating with the heat dissipation channel, the second inlet is located in a downstream position of the first inlet, and the second inlet communicates with each air exhaust vent in the at least one fan layer by using the air duct component.

7. The heat dissipation apparatus according to claim 6, wherein:
the radiator comprises a substrate and a plurality of heat dissipation sheets vertically mounted on the substrate, the plurality of heat dissipation sheets are disposed in parallel on the substrate, and the heat dissipation channel is formed between every two adjacent heat dissipation sheets; and
an end opening formed at ends of every two adjacent heat dissipation sheets is the first inlet, and a top opening formed at tops that are of every two adjacent heat dissipation sheets and are away from the substrate is the second inlet.

8. The heat dissipation apparatus according to claim 7, wherein each heat dissipation sheet comprises a front heat dissipation section and a rear heat dissipation section, wherein:
the front heat dissipation section is closer to the first inlet than the rear heat dissipation section;
the top opening formed at tops of every two adjacent front heat dissipation sections is the second inlet; and
a height of the front heat dissipation section relative to the substrate is not higher than a height of the rear heat dissipation section relative to the substrate.

9. The heat dissipation apparatus according to claim 8, wherein along a direction from the front heat dissipation section to the rear heat dissipation section, a height of the front heat dissipation section relative to the substrate gradually increases to a height the same as that of the rear heat dissipation section.

10. The heat dissipation apparatus according to claim 6, wherein
the air duct component comprises a top panel and side panels disposed surrounding the top panel, and the top panel and the side panels form an air duct; and
the air exhaust vents, the first inlets, and the second inlets of each of the at least two fan layers communicate with the air duct.

11. The heat dissipation apparatus according to claim 10, wherein:
the heat dissipation apparatus comprises two fan layers from the at least two fan layers, which are respectively a first fan layer located in an inner layer and a second fan layer located in an outer layer;
the air duct component comprises a partition panel disposed in the air duct;
a first end of the partition panel is connected to the radiator, and a second end of the partition panel extends to a contact area between the first fan layer and the second fan layer;
the partition panel separates the air duct into a first air duct and a second air duct;
a first end of the first air duct communicates with each air exhaust vent in the first fan layer, and a second end of the first air duct communicates with the first inlet; and
a first end of the second air duct communicates with each air exhaust vent in the second fan layer, and a second end of the second air duct communicates with the second inlet.

12. The heat dissipation apparatus according to claim 10, wherein:
the heat dissipation apparatus comprises four fan layers successively stacked, which are successively a first fan layer, a second fan layer, a third fan layer, and a fourth fan layer from an inner layer to an outer layer;
the air duct component comprises a partition panel disposed in the air duct;
the partition panel separates the air duct into a first air duct and a second air duct; and
the first inlet communicates with each air exhaust vent in the first fan layer through the first air duct, and the second inlet communicates with each air exhaust vent in the second fan layer, the third fan layer, and the fourth fan layer through the second air duct.

13. The heat dissipation apparatus according to claim 10, wherein:
the heat dissipation apparatus comprises four fan layers successively stacked, which are successively a first fan layer, a second fan layer, a third fan layer, and a fourth fan layer from an inner layer to an outer layer;
the air duct component comprises three partition panels disposed in an air duct;
the three partition panels separate the air duct into a first air duct, a second air duct, a third air duct, and a fourth air duct; and
the first inlet communicates with each air exhaust vent in the first fan layer through the first air duct, the second inlet communicates with each air exhaust vent in the second fan layer through the second air duct, the second inlet communicates with each air exhaust vent in the third fan layer through the third air duct, and the second inlet communicates with each air exhaust vent in the third fan layer through the fourth air duct.

14. The heat dissipation apparatus according to claim 13, wherein a first position in which the fourth air duct communicates with the second inlet is located at a downstream position of a second position in which the second air duct communicates with the second inlet, and a third position in which the third air duct communicates with the second inlet is located between the first position and the second position.

15. A photovoltaic inverter, comprising:
a plurality of switch devices; and
a heat dissipation apparatus comprising:
a radiator comprising a heat dissipation channel;
an air duct component; and
at least two fan layers, wherein the at least two fan layers are stacked in a direction perpendicular to a faying surface of the radiator, each fan layer comprises at least one fan, the at least one fan comprises an air exhaust vent, the heat dissipation channel comprising a first inlet that faces one of the fan layers, the first inlet communicates with each air exhaust vent in the at least one fan layer by using the air duct component, and in two adjacent fan layers, an air intake vent of the at least one fan in an inner fan layer communicates with at least one interval space in an outer fan layer; and
the plurality of switch devices being disposed in an array, and a row direction of the plurality of switch devices is perpendicular to an extension direction of the heat dissipation channel in the heat dissipation apparatus.

16. The photovoltaic inverter according to claim 15, wherein the photovoltaic inverter further comprises:
an inverter cabinet comprising:
an electrical cavity;
a heat dissipation cavity that is isolated from the electrical cavity; and
wherein the plurality of switch devices are disposed in the electrical cavity, the heat dissipation apparatus is disposed in the heat dissipation cavity, and the plurality of switch devices are arranged directly toward a heat dissipation sheet in the heat dissipation cavity.

17. The photovoltaic inverter according to claim 16, wherein the inverter cabinet comprises:
an intermediate partition panel that separates the inverter cabinet into the heat dissipation cavity and the electrical cavity, wherein a faying surface of the radiator is bonded to the intermediate partition panel; and
the at least two fan layers comprise two fan layers that are disposed on the intermediate partition panel and are located at an end of the radiator parallel to the heat dissipation channel; and
a first fan layer close to the intermediate partition panel comprises two fans, and a second fan layer away from the intermediate partition panel comprises one fan, and each fan comprises an air intake vent and an air exhaust vent.

18. The photovoltaic inverter according to claim 17, wherein:

one interval space is obtained through separation by the two fans in the first fan layer close to the intermediate partition panel, two interval spaces are obtained through separation by the one fan in the second fan layer away from the intermediate partition panel, and an extension direction of the interval space is parallel to an extension direction of the heat dissipation channel; and each air intake vent in the first fan layer close to the intermediate partition panel communicates with one interval space in the second fan layer away from the intermediate partition panel, and the air intake vent in the second fan layer away from the intermediate partition panel communicates with the interval space in the first fan layer close to the intermediate partition panel.

19. The photovoltaic inverter according to claim 17, wherein the radiator comprises a second inlet communicating with the heat dissipation channel, the second inlet is located in a downstream position of the first inlet, and the second inlet communicates with each air exhaust vent in the at least one fan layer by using the air duct component.

20. The photovoltaic inverter according to claim 19, wherein:

the radiator comprises a substrate and a plurality of heat dissipation sheets vertically mounted on the substrate, the plurality of heat dissipation sheets are disposed in parallel on the substrate, and the heat dissipation channel is formed between every two adjacent heat dissipation sheets; and an end opening formed at ends of every two adjacent heat dissipation sheets is the first inlet, and a top opening formed at tops that are of every two adjacent heat dissipation sheets and are away from the substrate is the second inlet.

* * * * *